United States Patent [19]

Takahashi et al.

[11] Patent Number: 4,766,376
[45] Date of Patent: Aug. 23, 1988

[54] MAGNETIC POSITION DETECTOR FOR DETECTING AN ABSOLUTE POSITION OF A MOVABLE MEMBER

[75] Inventors: Tadashi Takahashi; Kunio Miyashita; Syouichi Kawamata, all of Hitachi, Japan

[73] Assignee: Hitachi, Ltd., Tokyo, Japan

[21] Appl. No.: 896,255

[22] Filed: Aug. 14, 1986

[30] Foreign Application Priority Data

Aug. 14, 1985 [JP] Japan .................... 60-177642

[51] Int. Cl.$^4$ .................................................. G01B 7/30
[52] U.S. Cl. ................................ 324/208; 338/32 R
[58] Field of Search ............... 324/207, 208, 252, 173, 324/151, 152, 174; 338/32 R; 340/870.31, 870.32, 870.35; 360/110, 113, 136

[56] References Cited

U.S. PATENT DOCUMENTS

| | | | |
|---|---|---|---|
| 3,993,946 | 11/1976 | Makino | 324/208 |
| 4,274,053 | 6/1981 | Ito et al. | 324/208 X |
| 4,319,188 | 3/1982 | Ito et al. | 324/208 X |
| 4,403,187 | 9/1983 | Takahashi et al. | 324/252 X |
| 4,418,372 | 11/1983 | Hayashida et al. | 324/252 X |
| 4,594,548 | 6/1986 | Takahashi et al. | 324/208 |
| 4,599,561 | 7/1986 | Takahashi et al. | 324/252 X |
| 4,628,259 | 12/1986 | Takahashi et al. | 324/208 |
| 4,677,377 | 6/1987 | Takahashi et al. | 324/252 X |

FOREIGN PATENT DOCUMENTS 59-108193  6/1984  Japan .

*Primary Examiner*—Reinhard J. Eisenzopf
*Assistant Examiner*—Warren S. Edmonds
*Attorney, Agent, or Firm*—Antonelli, Terry & Wands

[57] ABSTRACT

A magnetic recording medium is provided on a rotary drum and is divided into a plurality of magnetic tracks. On each track is recorded a magnetic signal of a combination of a magnetization portion which consists of two consecutive unit magnets (pitch λ) and a no-magnetization portion having the same length (2λ) that are alternatingly arranged over the whole periphery of the track. First magnetoresistive elements in the magnetic sensor are arranged in pairs so as to be opposed to the magnetic tracks maintaining a distance of λ/2. Second magnetoresistive elements opposed to the magnetic track that correponds to the lowest-order bit of position detecting signals, are arranged in a number of $$\sum_{i=1}^{m} 2^i$$

for the first magnetoresistive element maintaining a distance of $$\left(\frac{1+2n}{8m}\right)SM_L$$

wherein $SM_L$ denotes the length of the magnetic signal of the magnetic track, m denotes the number of the increased bits (0<m≦2), and n denotes an integer (0≦n<2). Thus, detecting signals are obtained in a bit number in excess of the number of the magnetic tracks.

10 Claims, 8 Drawing Sheets

MAGNETIC POSITION DETECTOR FOR DETECTING AN ABSOLUTE POSITION OF A MOVABLE MEMBER

BACKGROUND OF THE INVENTION

1. Field of the Invention

The present invention relates to a position detector, and more specifically to an absolute position detector which employs a magnetic sensor and which is adapted to detecting an absolute position.

2. Description of the Prior Art

The inventors have previously developed a magnetic rotary sensor that employs a magnetic sensor and that works as an absolute position detector, as disclosed in Japanese Patent Laid-Open No. 108193/1984.

Namely, there is disclosed a magnetic position sensor in which a rotary drum is provided with a plurality of tracks, each track having a plurality of unit magnets, in order to eliminate magnetic interference among the tracks. However, this position sensor requires a magnetic track for each bit of the detecting output signal. To increase the resolving power therefore, the number of magnetic tracks must be increased in proportion thereto, resulting in an increase in the size of the sensor.

SUMMARY OF THE INVENTION

The object of the present invention is to provide an absolute position detector which has magnetic tracks of a number smaller than the number of bits of the output signals, which is small in size and which features a high resolving power.

According to the present invention, the absolute position detector comprises a magnetic recording medium carried by a member of which the position is to be detected, a plurality of magnetic tracks in which magnetic signals of required lengths are recorded onto the magnetic recording medium, and magnetoresistive elements that are arranged close to and opposed to the plurality of magnetic tracks and that change their electric resistances in response to a magnetic field established by a magnetic signal, so that changes in the resistance of the magnetoresitive elements are converted into electric signals to detect the absolute position of the member of which the position is to be detected, wherein each of said magnetic tracks produces a magnetic signal of a combination of a required number of unit magnets each having an N-to-S distance (pitch) of $\lambda$ that are continuously arranged in a direction in which will move the member of which the position is to be detected and a no-magnetization portion having the same length as the above portion, to decrease the number of magnetic tracks to be smaller than the number of bits of absolute position signals detected, and wherein first magnetoresistive elements are arranged in pairs maintaining a distance of $\lambda/2$ for each magnetic track, and second magnetoresistive elements opposed to the magnetic track of the least significance are arranged in a number of $$\sum_{i=1}^{m} 2^i$$

for said first magnetoresistive element maintaining a distance of $$\left(\frac{1+2n}{8m}\right)SM_L$$

wherein $SM_L$ denotes the length of said magnetic signal produced by the magnetic track of the least significance, m denotes a number of the increased bits for the magnetic track ($0 < m \leq 2$), and n denotes an integer ($0 \leq n < 2$), in order to obtain electric signals of a bit number greater than the number of the magnetic tracks from the combinations of the plurality of the magnetoresistive elements.

If described furthermore, the present invention has a magnetic recording medium carried by a member to be detected, and a magnetic sensor consisting of magnetoresistive elements arranged being opposed thereto, wherein the magnetic recording medium is divided into magnetic tracks of a number smaller than the number of bits of the output signals, the magnetoresistive elements opposed to the magnetic track of the lowest position are arranged in a plurality of numbers so that their electric phases will be different from one another, in order to obtain electric outputs of the low-order bits from the magnetic signal of the least significance track relying upon the combination of the plurality of magnetoresistive elements.

DETAILED DESCRIPTION OF THE PREFERRED EMBODIMENTS

An embodiment of a magnetic position sensor will, first, be described in conjunction with FIGS. 1 to 7 to detect an absolute position of a rotary member relying upon detecting output signals of four bits.

Figure 1:
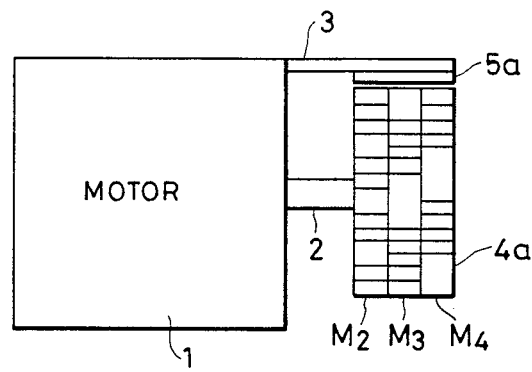
FIG. 1 is a diagram which schematically illustrates the whole structure of an absolute position detector according to an embodiment of the present invention.

In FIG. 1, reference numeral 1 denotes a motor, 2 denotes a shaft, 3 denotes a support plate which is mounted on a housing of the motor 1 to support a magnetic sensor 5a, and 4a denotes a magnetic drum which is mounted on the shaft 2, rotates together therewith, and has a magnetic recording medium placed on the surface thereof. As shown in an expansion plan of FIG. 2, the magnetic recording medium on the surface of the magnetic drum 4a is divided into three magnetic tracks $M_2$, $M_3$ and $M_4$, each magnetic track being provided with unit magnets that have an N-to-S length (N-to-S distance) of $\lambda$ and that are arranged as shown in FIG. 2.

That is, on the magnetic track $M_2$ are alternatingly arranged a magnetization portion 6a consisting of two consecutive unit magnets and a no-magnetization portion 6b having the same length ($2\lambda$) throughout the whole periphery of the track. On the magnetic track $M_3$ are alternatingly arranged a magnetization portion 7a consisting of four consecutive unit magnets and a no-magnetization portion having the same length ($4\lambda$) throughout the whole periphery of the track. On the magnetic track $M_4$ are arranged a magnetization portion 8a consisting of four consecutive unit magnets that are deviated in phase (deviated by $2\lambda$ in this case) relative to the magnetic track $M_3$, and a no-magnetization portion 8b.

In these magnetic tracks $M_2$, $M_3$ and $M_4$, combinations $SM_2$, $SM_3$ and $SM_4$ of magnetization portions 6a, 7a, 8a and no-magnetization portions 6b, 7b, 8b, are referred to as magnetic signals of the magnetic tracks. Combinations $SM_2$, $SM_3$, $SM_4$ of the magnetic tracks correspond to $2\pi$ in terms of electric angles of the signals that are detected from the magnetic tracks, respectively.

Figure 2:
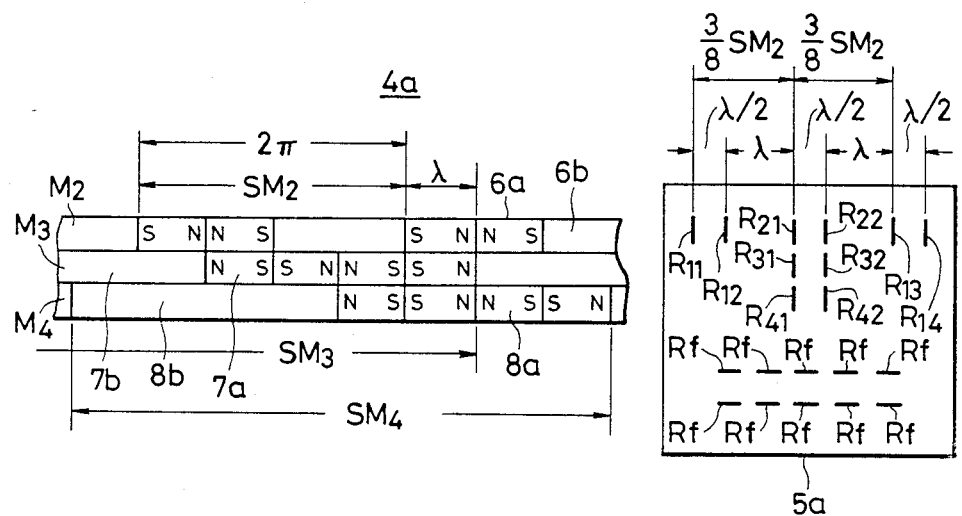
FIG. 2 is an expansion plan showing a magnetic drum and a magnetic sensor.

FIG. 2 is an expansion plan of the magnetic sensor 5a that is disposed being opposed to the magnetic drum 4a. Elements $R_{41}$ and $R_{42}$ are arranged maintaining a distance of nearly $\lambda/2$ so as to be opposed to the magnetic track $M_4$, the elements $R_{41}$ and $R_{42}$ pertaining to a first group of magnetoresistive elements. The magnetoresistive elements are arranged in a direction in parallel with the circumferential direction of the magnetic track $M_2$ (i.e., in parallel with the direction in which the track $M_2$ moves). Similarly, elements $R_{31}$ and $R_{32}$ in the first group of magnetoresistive elements are arranged maintaining a distance of $\lambda/2$ so as to be opposed to the magnetic track $M_3$, and magnetoresistive elements $R_{21}$, $R_{22}$ are arranged maintaining a distance of $\lambda/2$ so as to be opposed to the magnetic track $M_2$.

For the magnetic track $M_2$, there are further arranged elements $R_{11}$ to $R_{14}$ that pertain to a second group of magnetoresistive elements. Here, the distances between the magnetoresistive elements $R_{11}$ and $R_{12}$, and between the magnetoresistive elements $R_{13}$ and $R_{14}$, are $\lambda/2$, respectively. The distances between the magnetoresistive elements $R_{11}$ and $R_{21}$, and between the magnetoresistive elements $R_{21}$ and $R_{13}$, are $1\frac{1}{2}\lambda$, respectively. Here, as will be obvious from FIG. 2, the distance $1\frac{1}{2}\lambda$ is equal to $\frac{3}{8}SM_2$ as reckoned to one period $SM_2$ of the magnetic signal, and further corresponds to $\frac{3}{4}\pi$ in terms of the electric angle.

In addition to ten magnetoresistive elements, the magnetic sensor 5a further has ten fixed resistors Rf. The magnetoresistive elements and the fixed resistors Rf are formed on a chip by depositing a ferromagnetic material on an insulating substrate by metal vaporization or sputtering. The elements that work as fixed resistors Rf should be formed in a direction in which they do not respond to the magnetic field of the magnetic tracks.

The magnetoresistive elements exhibit resistance that varies depending upon the magnetic field; i.e., the resistance may decrease or increase depending upon the material. Described below is the case where the magnetoresistive elements are composed of a permalloy of which the electric resistance decreases in proportion to the magnetic field intensity.

Figure 3:
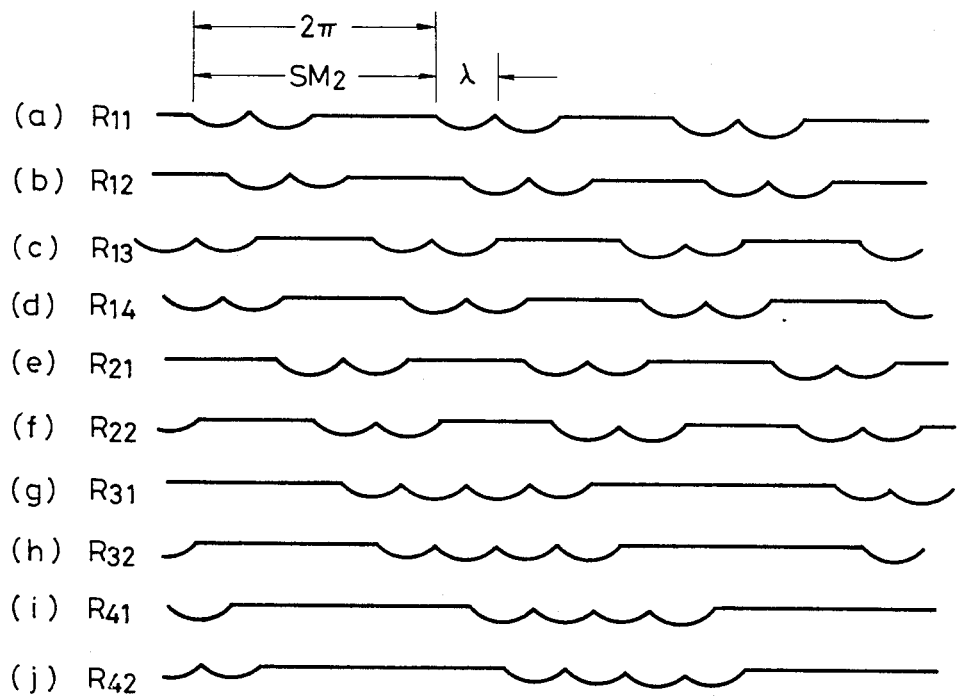
FIG. 3 is a diagram of waveforms when the resistances are changed to explain the operation.

As the magnetic drum 4a rotates, the magnetoresistive elements $R_{11}$ to $R_{42}$ in the magnetic sensor 5a change their resistances as shown in FIG. 3 due to magnetic signals of the magnetic tracks.

For example, the magnetoresistive element $R_{11}$ which is opposed to the magnetic track $M_2$ changes its resistance in response to the magnetic signal of the magnetic track $M_2$. Namely, a valley is formed by the first unit magnet SN in FIG. 2, and another valley is formed by the next consecutive unit magnet SN; i.e., two consecutive valleys are generated as shown in FIG. 3(a). The reluctance elements $R_{12}$, $R_{13}$, $R_{14}$, $R_{21}$ and $R_{22}$ also change their resistances at their positions of different phases as shown in FIGS. 3(b) to 3(f).

The magnetoresistive elements $R_{31}$ and $R_{32}$ also produce waveforms in which four valleys are generated consecutively in response to the magnetic signal of the magnetic track $M_3$ as shown in FIGS. 3(g) and 3(h). Moreover, the magnetoresistive elements $R_{41}$ and $R_{42}$ change their resistances as shown in FIGS. 3(i) and 3(j) in response to the magnetic signal of the magnetic track $M_4$.

Figure 4:
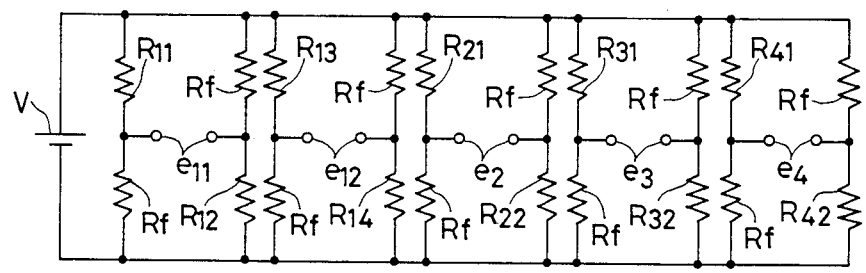
FIG. 4 is a diagram of connection of the magnetoresistive elements.

The magnetoresistive elements $R_{11}$ to $R_{42}$ constitute resistance bridges together with the fixed resistors Rf as shown in FIG. 4. A bridge circuit which includes the magnetoresistive elements $R_{11}$ and $R_{12}$ at the left end of FIG. 4 produces an output $e_{11}$ having a waveform that is shown in FIG. 5(a). Similarly, the bridge circuits produce outputs $e_{12}$, $e_2$, $e_3$ and $e_4$ having waveforms as shown in FIGS. 5(b), 5(c), 5(d) and 5(e).

Figure 6:
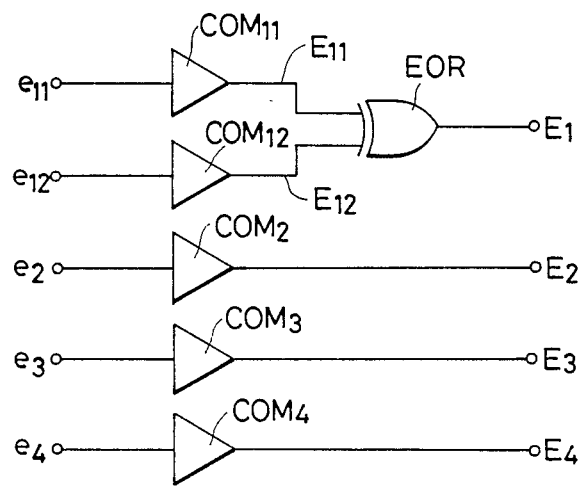
FIG. 6 is a diagram of a waveform shaping circuit.

These outputs are input to voltage comparators $COM_{11}$, $COM_{12}$, $COM_2$, $COM_3$, and $COM_4$ that produce outputs $E_{11}$, $E_{12}$, $E_2$, $E_3$ and $E_4$ of square waveforms as shown in FIGS. 7(a) to 7(f). Moreover, an output $E_1$ is obtained if the outputs $E_{11}$ and $E_{12}$ are passed through an exclusive OR circuit EOR that is shown in FIG. 6.

The thus obtained outputs $E_1$, $E_2$, $E_3$ and $E_4$ form position detecting signals of four bits. The above example has employed gray codes of four bits. However, it is also allowable to use other code depending upon the manner of recording the magnetic signals onto the magnetic recording medium.

As described above, there are obtained absolute positions of four bits from the three magnetic tracks that correspond to the high-order three bits of detecting signals. Thus, the magnetic drum is realized in a small size having a small inertia, making it possible to constitute a servo system which features a high precision.

In the above embodiment, the fixed resistors Rf were formed in the magnetic sensor. It is, however, allowable to form the fixed resistors Rf separately from the magnetic sensor.

Figure 9:
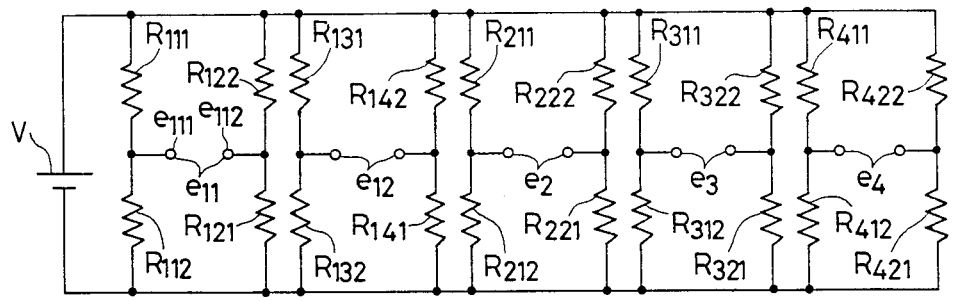
FIG. 9 is a connection diagram of the magnetoresistive elements.
Figure 10:
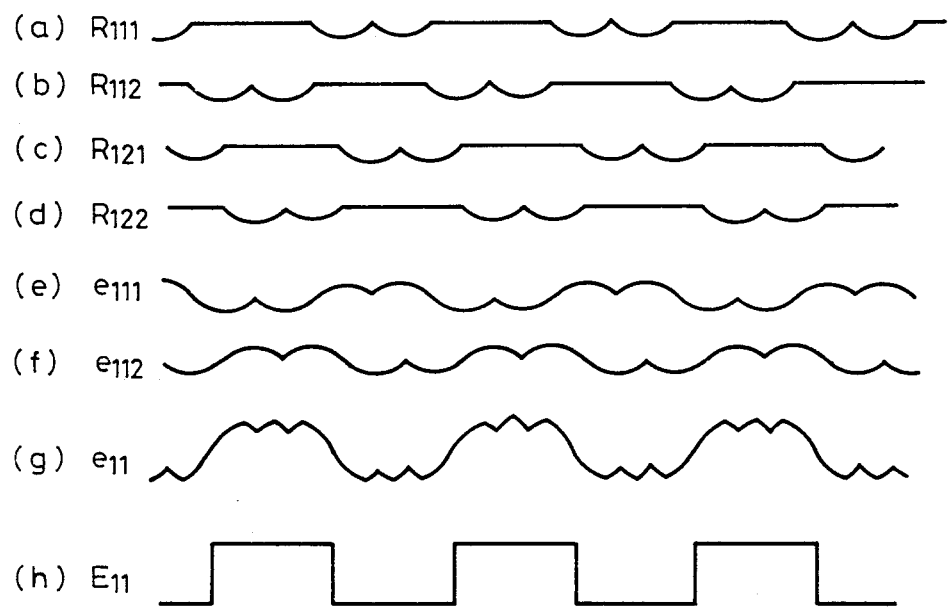
FIG. 10 is a diagram of waveforms for explaining the operation.

Another embodiment will be described in conjunction with FIGS. 8 to 10 in which bridges are constituted by the magnetoresistive elements only to increase the level of detecting signals and to stabilize the output waveforms. Also in this embodiment, the output signals consists of four bits.

Figure 8:
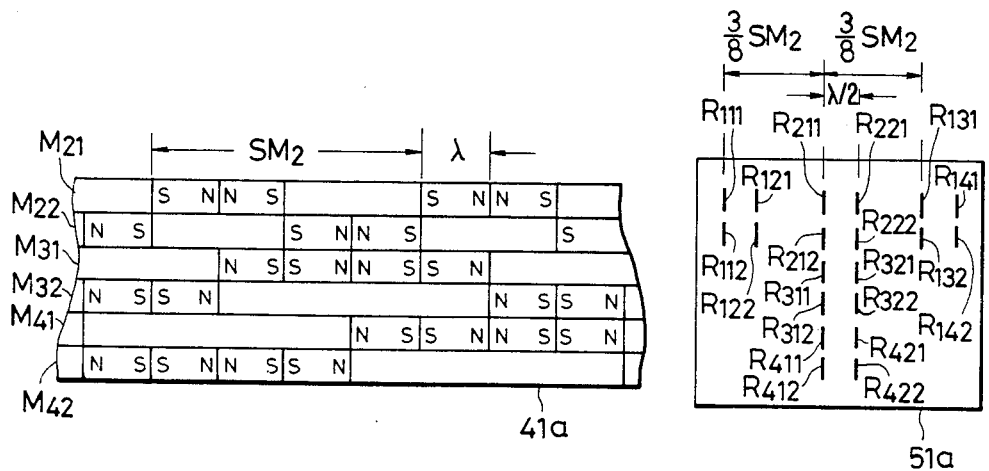
FIG. 8 is an expansion plan of a magnetic drum and a magnetic sensor in the absolute position detector according to another embodiment of the present invention.

Like FIG. 1, FIG. 8 is an expansion plan of a magnetic drum 41a and a magnetic sensor 51a, wherein the magnetic recording medium on the surface of the magnetic drum 41a is divided into six magnetic subtracks, and as will be apparent below, the magnetic subtracks $M_{21}$ and $M_{22}$, $M_{31}$ and $M_{32}$, and $M_{41}$ and $M_{42}$ correspond to the magnetic tracks $M_2$, $M_3$ and $M_4$ in FIG. 2, respectively. Unit magnets are arranged on the magnetic subtracks $M_{21}$, $M_{31}$ and $M_{41}$ quite in the same manner as that of FIG. 2. On the magnetic tracks $M_{22}$, $M_{32}$ and $M_{42}$ are arranged the unit magnets symmetrically to those of the magnetic subtracks $M_{21}$, $M_{31}$ and $M_{41}$. That is, the portions that correspond to magnetization portions of the magnetic subtracks $M_{21}$, $M_{31}$ and $M_{41}$ are comprised of no-magnetization portions and, conversely, unit magnets are arranged on the no-magnetization portions.

On the magnetic sensor 51a are arranged first and second magnetoresistive elements $R_{111}$, $R_{121}$, $R_{211}$, $R_{221}$, $R_{131}$ and $R_{141}$ to be opposed to the magnetic subtracks $M_{21}$, and are further arranged magnetoresistive elements $R_{112}$, $R_{122}$, $R_{212}$, $R_{222}$, $R_{132}$ and $R_{142}$ to be opposed to the magnetic subtracks $M_{22}$ in the same manner as in FIG. 2. There are further arranged first magnetoresistive elements $R_{311}$ and $R_{321}$, first magnetoresistive elements $R_{312}$ and $R_{322}$, first magnetoresistive elements $R_{411}$ and $R_{421}$, and first magnetoresistive elements $R_{412}$ and $R_{422}$ so as to be opposed to the magnetic subtracks $M_{31}$, $M_{32}$, $M_{41}$ and $M_{42}$, respectively. Distances among the magnetoresistive elements have quite the same relationship as that of FIG. 2. The magnetoresistive elements are so wired as to constitute resistance bridges shown in FIG. 9.

As the magnetic drum 41a rotates, the magnetoresistive elements change their resistances quite in the same manner as the above-mentioned embodiment. That is, the magnetoresistive elements $R_{111}$, $R_{112}$, $R_{121}$ and $R_{122}$ change their resistances as shown in FIGS. 10(a) to 10(d). Therefore, outputs shown in FIGS. 10(e) and 10(f) are obtained at the output terminals $e_{111}$ and $e_{112}$ of the bridge circuit; i.e., symmetrical and stable outputs are obtained across the two terminals as shown in FIG. 10(g). If these outputs are input to the circuit shown in FIG. 6, there are obtained outputs $E_{11}$ of which the waveforms are shaped as shown in FIG. 10(h). The outputs $E_{11}$ are quite the same as the outputs $E_{11}$ of FIG. 7.

Figure 7:
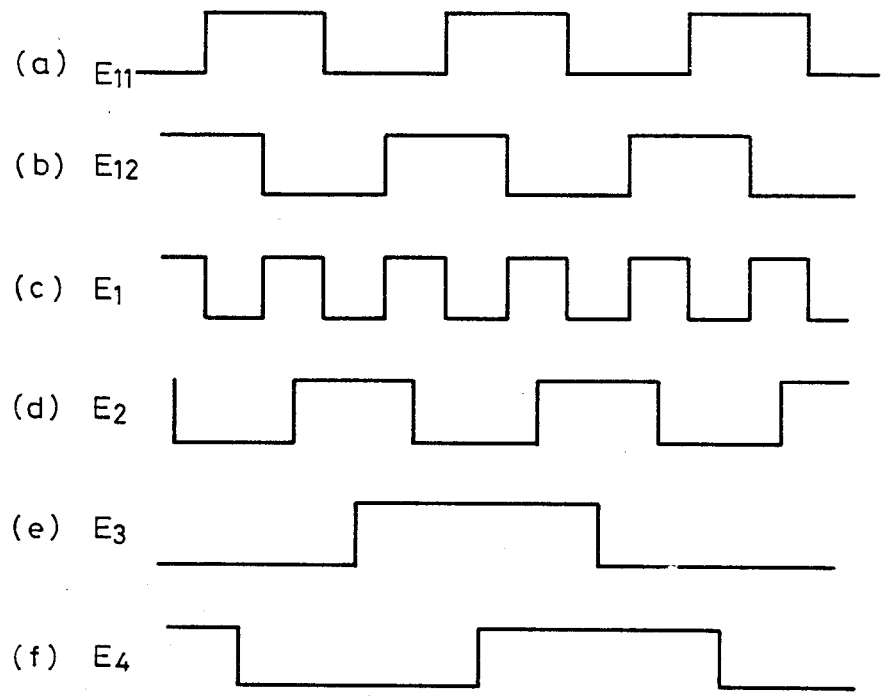
FIG. 7 is a diagram of output waveforms.

Thus, other outputs can also be obtained to obtain absolute position detecting outputs of four bits in the same manner as in FIG. 7. The output $e_{11}$ of the bridge shown in FIG. 10 has a doubled amplitude compared with the same output $e_{11}$ of FIG. 5, has a symmetrical waveform, and can be stably shaped for its waveform through the voltage comparator $COM_{11}$ to increase the precision.

In the foregoing was described an embodiment to obtain outputs of four bits from the three magnetic tracks.

Next, an embodiment will be described in conjunction with FIGS. 11 to 14 to obtain outputs of five bits from the three magnetic tracks.

Figure 11:
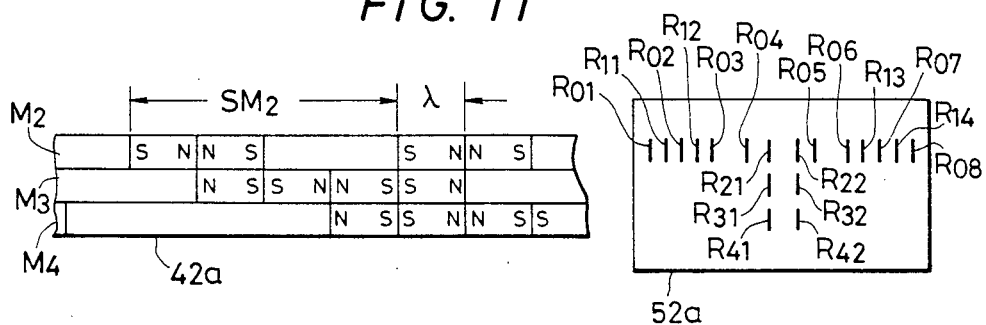
FIG. 11 is an expansion plan of a magnetic drum and a magnetic sensor in the absolute position detector according to a further embodiment of the present invention.

Like FIG. 2, FIG. 11 is an expansion plan of a magnetic drum 42a and a magnetic sensor 52a, wherein the magnetic recording medium on the surface of the magnetic drum 42a is divided into three magnetic tracks $M_4$ to $M_2$ on which are recorded magnetic signals maintaining the same arrangements as those of the magnetic tracks $M_4$ to $M_2$ of FIG. 2.

Figure 12:
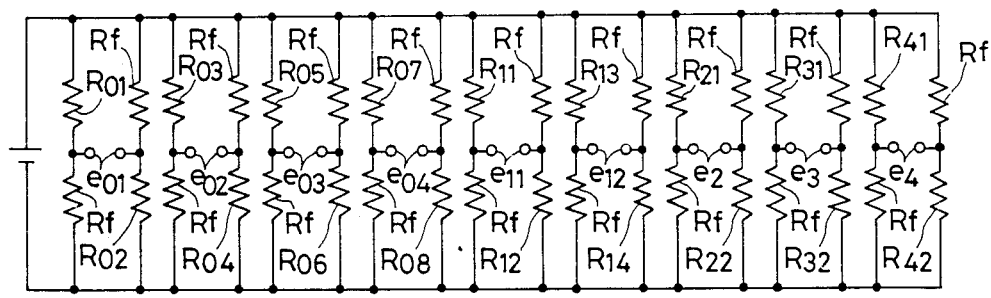
FIG. 12 is a connection diagram of the magnetoresistive elements.

On the magnetic sensor 52a are arranged the magnetoresistive elements being opposed to the magnetic tracks as shown. In this embodiment, the fixed resistors Rf are not formed on the sensor 52a but are arranged on a separate accomodating member. Bridge circuits shown in FIG. 12 are constituted by these magnetoresistive elements and fixed resistors. In this magnetic sensor 52a, the magnetoresistive elements $R_{11}$, $R_{12}$, $R_{13}$, $R_{14}$, $R_{21}$, $R_{22}$, $R_{31}$, $R_{32}$, $R_{41}$ and $R_{42}$ are corresponded to the magnetoresistive elements $R_{11}$, $R_{12}$, $R_{13}$, $R_{14}$, $R_{21}$, $R_{22}$, $R_{31}$, $R_{32}$, $R_{41}$ and $R_{42}$ of FIG. 2, and are arranged quite in the same manner. The bridge circuits are also constituted quite in the same manner. When the magnetic drum 42a is rotated, therefore, the bridge circuits produce the outputs $e_{11}$, $e_{12}$, $e_2$, $e_3$ and $e_4$ that are the same as those of FIG. 5. Therefore, the signals $E_1$, $E_2$, $E_3$ and $E_4$ obtained by processing these outputs become quite the same as the signals $E_1$, $E_2$, $E_3$ and $E_4$ shown in FIGS. 7(c) to 7(f). However, the magnetic sensor 52a is further provided with second magnetoresistive elements $R_{01}$, $R_{02}$, $R_{03}$, $R_{04}$, $R_{05}$, $R_{06}$, $R_{07}$ and $R_{08}$. Here, the magnetoresistive elements $R_{01}$ and $R_{02}$, $R_{03}$ and $R_{04}$, $R_{05}$ and $R_{06}$, and $R_{07}$ and $R_{08}$ are arranged maintaining a distance $\lambda/2$, respectively. The magnetoresistive elements $R_{01}$, $R_{03}$, $R_{05}$ and $R_{07}$ are arranged being separated away from the magnetoresistive element $R_{21}$ by $1\frac{3}{4}\lambda$, $\frac{3}{4}\lambda$, $\frac{7}{4}\lambda$, and $1\frac{7}{4}\lambda$, respectively.

As the magnetic drum 42a rotates, the magnetoresistive elements change their resistances in response to the magnetic signals in the same manner as the aforementioned embodiment. Among the bridge circuits of FIG. 12, therefore, the bridge circuits that include the second magnetoresistive elements $R_{01}$ to $R_{08}$ produce the voltages $e_{01}$ to $e_{04}$ as shown in FIGS. 14(a) to 14(d).

Figure 13:
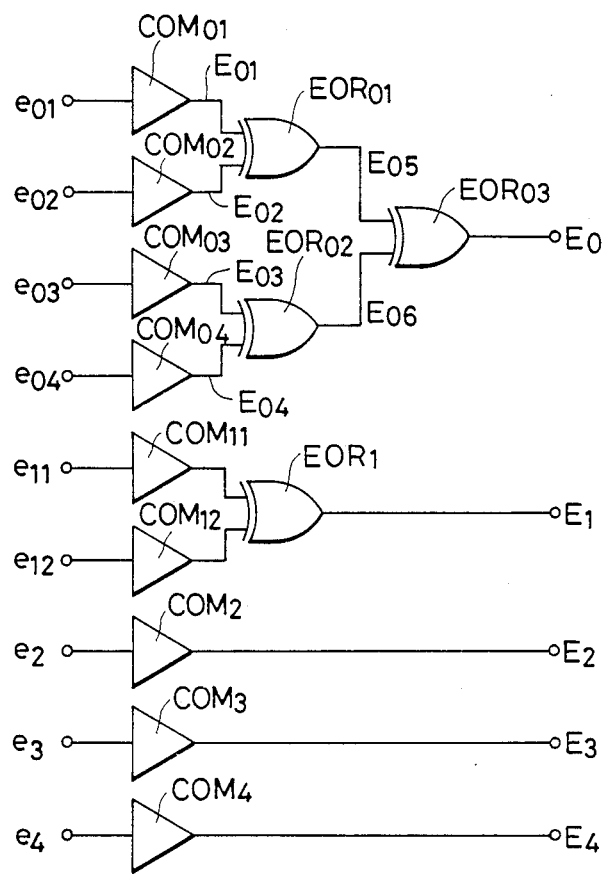
FIG. 13 is a diagram of a waveform shaping circuit.
Figure 14:
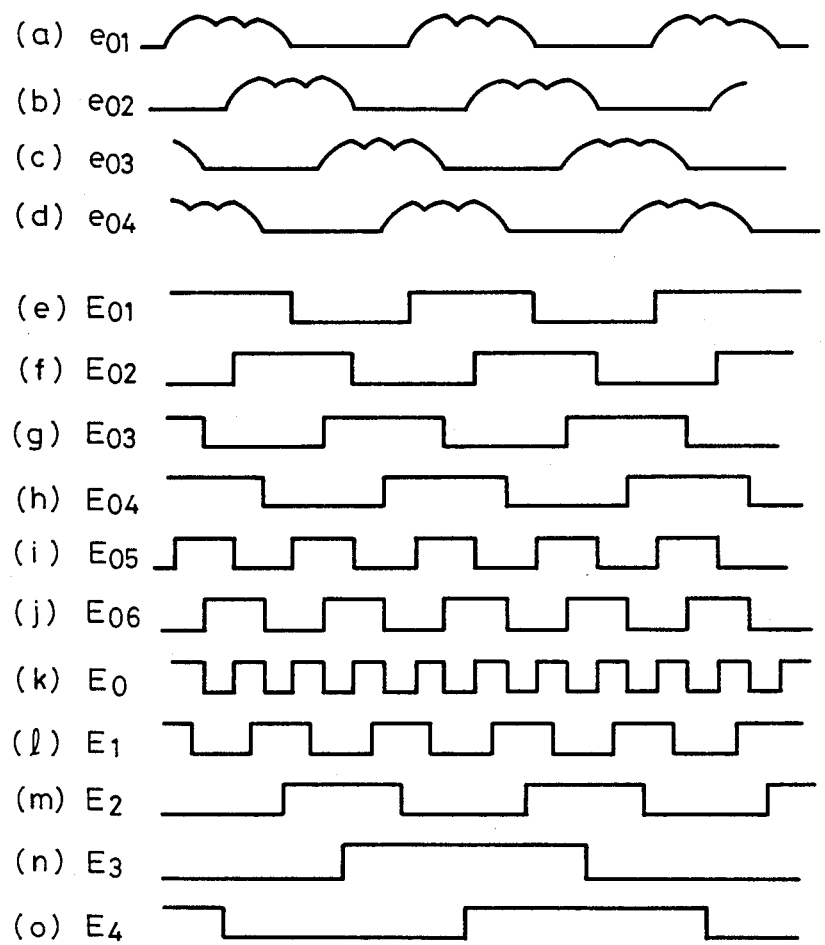
FIG. 14 is a diagram of output waveforms.

If the output voltages of the bridge circuits are input to the circuits that are shown in FIG. 13, there are obtained output voltages $E_{01}$ to $E_{04}$ of which the waveforms are shaped as shown in FIGS. 14(e) to 14(h). Moreover, if the output voltages $E_{01}$ and $R_{02}$, and $R_{03}$ and $E_{04}$ are allowed to pass through the exclusive OR circuits $EOR_{01}$ and $EOR_{02}$, respectively, there are obtained output voltages $E_{05}$ and $E_{06}$ as shown in FIGS. 14(i) and 14(j). If these outputs are further passed through an exclusive OR circuit $EOR_{03}$, there is obtained an output $E_0$ as shown in FIG. 14(k).

Figure 5:
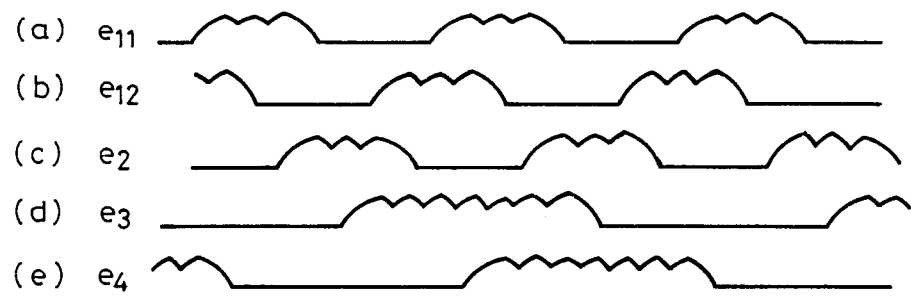
FIG. 5 is a diagram of waveforms for explaining the operation.

Here, the outputs $e_{11}$, $e_{12}$, $e_2$, $e_3$ and $e_4$ of the bridge circuits that include the first magnetoresistive elements $R_{11}$ to $R_{42}$ are quite the same as the outputs of FIG. 5, and the outputs $E_1$ to $E_4$ obtained by processing these outputs are also quite the same as the outputs of FIG. 7. Therefore, the outputs $E_0$ to $E_4$ are corresponded to absolute positions of five bits. Since the outputs of five bits can be obtained from the three magnetic tracks that correspond to three bits, the magnetic drum can be realized in a small size having a small inertia.

In the above embodiment, it is allowed, as a matter of course, to arrange the fixed resistors in the magnetic sensor.

In the foregoing were described the embodiments in which a magnetic signal $SM_2$ of a magnetic track corresponding to the lowest-order bit of position detecting signal was comprised of a magnetization portion consisting of two consecutive unit magnets and a no-magnetization portion having the same length. Next, described below is the case where the magnetic signal $SM_2$ is comprised of a magnetization portion consisting of four consecutive unit magnets and a no-magnetization portion having the same length. Here, the position detecting outputs consist of signals of four bits.

Figure 15:
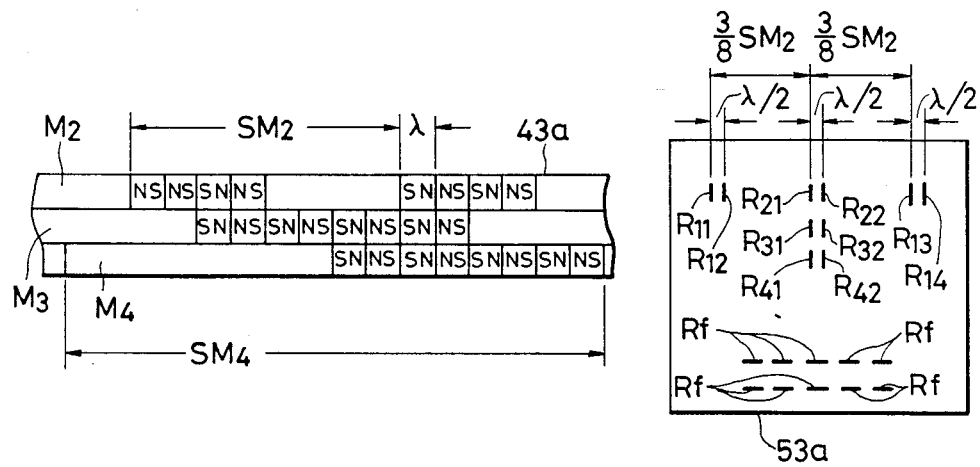
FIG. 15 is an expansion plan of a magnetic drum and a magnetic sensor in the absolute position detector according to still further embodiment of the present invention.
Figure 16:
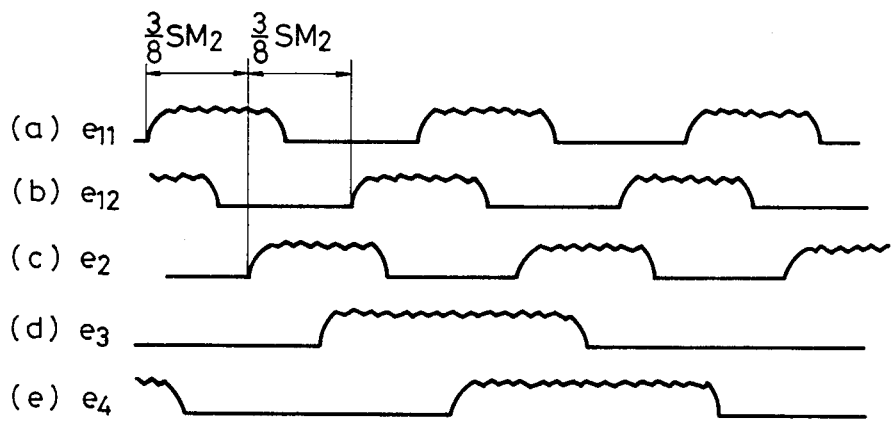
FIG. 16 is a diagram of output waveforms.

In FIG. 15, reference numeral 43a denotes a magnetic drum, and 53a denotes a magnetic sensor, which correspond to the magnetic drum 4a and the magnetic sensor 5a shown in the expansion plan of FIG. 2.

The magnetic recording medium on the surface of the magnetic drum 43a is divided into three magnetic tracks $M_2$, $M_3$ and $M_4$ as shown in FIG. 15. On the magnetic track $M_2$ are alternatingly arranged a magnetization portion consisting of four consecutive unit magnets each having a pitch $\lambda$ and a no-magnetization portion having the same length ($4\lambda$) throughout the whole periphery of the track. On the magnetic tracks $M_3$ and $M_4$ are also alternatingly arranged a magnetization portion consisting of eight consecutive unit magnets and a no-magnetization portion having the same length ($8\lambda$). Here, however, the magnetization portions of the two tracks are deviated by a length of $4\lambda$ relative to each other.

On the magnetic sensor 53a are arranged the magnetoresistive elements and the fixed resistors Rf that are opposed to the magnetic tracks maintaining distances as shown in FIG. 2. If the bridge circuits are constituted as shown in FIG. 4 using these magnetoresistive elements, the outputs $e_{11}$, $e_{12}$, $e_2$, $e_3$ and $e_4$ obtained across the output terminals of these bridge circuits become as shown in FIGS. 16(a) to 16(e). If these outputs are processed by the circuits of FIG. 6, there are obtained outputs $E_{11}$, $E_{12}$, $E_2$, $E_3$ and $E_4$ as shown in FIG. 7. Comparison of the waveforms of FIG. 5 with the waveforms of FIG. 16 indicates that the waveforms of FIG. 16 have small ripples, are sharp at the ends of the waves, and are effective to increase the precision.

Fundamental structures of the above-mentioned embodiments are summarized below.

Each magnetic track constitutes a magnetic signal relying upon a magnetization portion consisting of a plurality (k) of unit magnets each having a pitch $\lambda$ and a no-magnetization portion having the same length ($k\lambda$). The first magnetoresistive elements are arranged in pairs maintaining a distance of $\lambda/2$ in the magnetic sensor so as to be opposed to the magnetic tracks. The second magnetoresistive elements are provided so as to be opposed to a magnetic of the least significance that corresponds to the lowest-order bit of position detect signal. The second magnetoresistive elements are arranged in a number of $$\sum_{i=2}^{m} 2^i \ (m = 1 \text{ or } 2)$$

for the first magnetoresistive element maintaining a distance of $$\left(\frac{1+2n}{8m}\right) SM_L,$$

where $SM_L$ dnotes the length of the magnetic signal produced by the magnetic track of the least significance, m denotes a number of the increased bits ($<m\leq 2$) and n denotes an integer ($0\leq n<2$).

The aforementioned embodiments have dealt with the rotary sensor as a member of which the position is to be detected. However, it is also possible, based upon the same principle, to detect absolute positions of the members that undergo linear motion. Namely, the embodiment shown in FIG. 2 can also be used to detect absolute positions of members that undergo linear motion.

According to the present invention, there is provided an absolute position detector which has magnetic tracks of a number smaller than the number of bits of output signals, which is small in size, and which has a high resolving power.

As mentioned above, the present invention makes it possible to detect absolute positions corresponding to the number of bits greater than the number of magnetic tracks. Therefore, a member such as a rotary member to be detected, can be relized in a small size enabling the apparatus to be constructed in a small size. Consequently, the member to be detected has a small inertia, contributing to increasing the speed of response.

We claim:

1. A magnetic position detector for detecting an absolute position of a movable member to produce a digital position signal of plural bits encoded in accordance with the absolute position, comprising:

a magnetic recording medium movable in response to the movement of the movable member, and having a plurality of magnetic tracks arranged in the moving direction thereof, each magnetic track having a predetermined positional significance with magnetic signals of required lengths SM being recorded along said magnetic tracks, the length SM of the magnetic tracks being determined in accordance with the respective positional significance and being smallest in a least significant one of said magnetic tracks;

a first group of magnetoresistive element pairs, each element pair being composed of two magnetoresistive elements spaced at a predetermined interval and provided on a stationary part of the position detection so that each element pair is close to and opposed to a corresponding one of said magnetic tracks to produce a periodic output signal as said magnetic recording medium moves, one cycle of the periodic output signal being dependent on the length SM of the magnetic signal of the corresponding magnetic track;

a second group of magnetoresistive element pairs, each element pair being composed of two magnetoresistive elements spaced at the predetermined interval and provided on the stationary part of the position detector so that every element pair is close to and opposed to the least significant magnetic track to produce periodic output signals as said magnetic recording medium moves, one cycle of the periodic output signals being dependent on the length $SM_L$ of the magnetic signal of the least significant track and having a predetermined phase difference from the periodic output signal produced by the magnetoresistive element pair belonging to said first group and opposed to the least significant track; and means for processing the output signals produced by said first group of magnetoresistive element pairs to create a main position signal of plural bits, for processing the output signals produced by said second group of magnetoresistive element pairs to create an auxiliary position signal of at least one bit indicative of positions finer than those indicated by the least significant digit of the main position signal, and for forming the digital position signal by combining the main and auxiliary position signals so as to obtain the digital position signal having a number of bits greater than the number of said magnetic tracks.

2. A magnetic position detector as defined in claim 1, wherein the magnetic signals of said magnetic tracks are composed of the combination of a magnetization portion consisting of a number k of continuously arranged unit magnets each having an N to S distance of $\lambda$ and a no-magnetization portion having the same length $k\lambda$ as the magnetization portion, the number k of the unit magnets being determined in accordance with the positional significance of the magnetic tracks, and two magnetoresistive elements of each of said first and second element pairs are spaced a distance of $\lambda/2$ from each other.

3. A magnetic position detector as defined in claim 2, wherein said second group of magnetoresistive element pairs are arranged at positions that are separated by a distance determined by the formula $\{(n+2n)/8m\}$ $SM_L$ from the magnetoresistive element pair belonging to said first group and opposed to the least significant magnetic track, wherein m=1, and n=0 and 1.

4. A magnetic position detector as defined in claim 3, wherein said second group of magnetoresistive element pairs are further arranged at positions that are separated by the distance determined by the formula $\{(1+2n)/8m\}$ $SM_L$ from the magnetoresistive element pair belonging to said first group and opposed to the least significant magnetic track, wherein m=2, and n=0, 1, 2 and 3.

5. A magnetic position detector as defined in claim 1, wherein each of said magnetic tracks is divided into two subtracks, the magnetic signals of the respective magnetic tracks being recorded on the subtracks in a manner so that the magnetization portion of one of the subtracks corresponds to the no-magnetization portion of the other subtrack, and two sets of said first and second magnetoresistive element pairs are provided for every magnetic track so as to detect the magnetic signals of the two subtracks and providing output signals which are added so as to double the amplitude of the periodic output signals of the respective element pairs.

6. A magnetic position detector for detecting an absolute position of a movable member to produce a digital position signal of plural bits encoded in accordance with the absolute position, comprising:

a magnetic recording medium movable in response to the movement of the movable member and having a plurality of magnetic tracks thereon, each of the magnetic tracks having a predetermined positional significance and being divided into two subtracks, magnetic signals of a required length SM being recorded so that a recorded portion of magnetic signals on one of the subtracks correspond to a no-recorded portion of magnetic signals on the other subtrack, the length SM of the magnetic signals of the respective magnetic tracks being determined in accordance with the positional significance and being smaller in at least significant one of said magnetic tracks;

a first group of magnetoresistive element pairs, each element pair consisting of two magnetoresistive elements spaced at a predetermined interval, two of said element pairs being assigned to each magnetic track so that one of the two element pairs is close to and opposed to one of the subtracks of a corresponding magnetic track and the other element pair is close to and opposed to the other subtrack thereof and produce periodic output signals as said magnetic recording medium moves which are added to double the amplitude of the periodic output signals of the respective element pairs, one cycle of an added periodic output signal being dependent on the length SM of the magnetic signal of the corresponding magnetic track;

a second group of magnetoresistive element pairs, each element pair consisting of two magnetoresistive elements spaced at the predetermined interval, all of said element pairs being classified into two sets so that a first one of the two sets of said element pairs is close to and opposed to one of the two subtracks of the least significant magnetic track and the other set is close to and opposed to the other subtrack thereof and produce periodic output signals as said magnetic recording medium moves which are added to double the amplitude of the periodic output signals of the respective element pairs, one cycle of an added periodic output signal being dependent on the length $SM_L$ of the magnetic signal of the least significant magnetic track and having a predetermined phase difference from the periodic output signal produced by the magnetoresistive element pairs belonging to said first group and opposed to the least significant track; and means for processing the output signals produced by said first group of magnetoresistive element pairs to create a main position signal of plural bits, for processing the output signals produced by said second group of magnetoresistive element pairs to create an auxiliary position signal of at least one bit indicative of positions finer than those indicated by the least significant digit of the main position signal, and for forming the digital position signal by combining the main and auxiliary position signals so as to obtain the digital position signal having a number of bits greater than the number of said magnetic tracks.

7. A magnetic position detector as defined in claim 6, wherein the magnetic signals recorded on the respective magnetic tracks are composed of the combination of a magnetization portion consisting of a required number k of consecutively arranged unit magnets each having an N to S distance of $\lambda$ and a no-magnetization portion having the same length $k\lambda$ as the magnetization portion, the number k of the unit magnets being determined in accordance with the positional significance of the respective magnetic tracks, and the distance between the two elements in each of said first and second magnetoresistive element pairs of maintained at $\lambda/2$.

8. A magnetic position detector as defined in claim 7, wherein three magnetic tracks are provided on said magnetic recording medium, the magnetic signal on the least significant magnetic track being recorded by two consecutive unit magnets, the magnetic signal on a second significant magnetic track being recorded by four consecutive unit magnets so that the magnetic signal on the second significant magnetic track are shifted by $\frac{1}{4}$ of the length $SM_L$ of the magnetic signal on the least significant magnetic track and the magnetic signal on a most significant magnetic track is recorded by four consecutive unit magnets so that the magnetic signal on the most significant magnetic track is shifted by ¼ of the length of the magnetic signal of the second significant magnetic track.

9. A magnetic position detector as defined in claim 8, wherein two element pairs of the first set of said second group of magnetoresistive element pairs are provided at positions that are spaced by a distance of $(\pm\frac{3}{8})SM_L$ from the magnetoresistive element pair belonging to said first group of element pairs and opposed to the first subtract of the least significant magnetic track with respect to the moving direction of said magnetic recording medium and two element pairs of the second set of said second group of magnetoresistive element pairs are provided at positions that are spaced by a distance of $(\pm\frac{3}{8})SM\lambda$ from the magnetoresistive element pair belonging to said first group of element pairs and opposed to the second subtract of the least significant magnetic track with respect to the moving direction of said magnetic recording medium.

10. A magnetic position detector as defined in claim 9, wherein four element pairs of the first set of said second group of magnetoresistive element pairs are provided at positions that are spaced by a distance of $(\pm 3/16)SM_L$ and $(\pm 7/16)SM_L$ from the magnetoresistive element pair belonging to said first group of element pairs and opposed to the first subtrack of the least significant magnetic track with respect to the moving direction of said magnetic recording medium, and four element pairs of the second set of said second group of magnetoresistive element pairs are provided at positions that are spaced by a distance of $(\pm 3/16)SM_L$ and $(\pm 7/16)SM_L$ from the magnetoresistive element pair belonging to said first group of element pairs and opposed to the second subtrack of the least significant magnetic track with respect to the moving direction of said magnetic recording medium.

* * * * *